United States Patent [19]

Yabu

[11] Patent Number: 4,907,021
[45] Date of Patent: Mar. 6, 1990

[54] PROJECTION EXPOSURE APPARATUS

[75] Inventor: Shuichi Yabu, Kawasaki, Japan

[73] Assignee: Canon Kabushiki Kaisha, Tokyo, Japan

[21] Appl. No.: 294,942

[22] Filed: Jan. 6, 1989

Related U.S. Application Data

[63] Continuation of Ser. No. 139,106, Dec. 24, 1987, abandoned, which is a continuation of Ser. No. 891,595, Aug. 1, 1986, abandoned.

[30] Foreign Application Priority Data

Aug. 5, 1985 [JP] Japan .................................. 60-171157

[51] Int. Cl.$^4$ ............................................... G03B 3/12
[52] U.S. Cl. .................................................... 353/101
[58] Field of Search ............... 353/100, 101, 121, 122; 355/52–54; 350/255, 518

[56] References Cited

U.S. PATENT DOCUMENTS

| 4,140,392 | 2/1979 | Lacombat et al. | 355/53 X |
| 4,236,790 | 12/1980 | Smith | 350/253 |
| 4,383,757 | 5/1983 | Phillips | 355/53 |
| 4,390,260 | 6/1983 | Prinz | 350/253 X |
| 4,420,233 | 12/1983 | Nohoto et al. | 353/122 |
| 4,676,631 | 6/1987 | Kosugi et al. | |
| 4,699,505 | 10/1987 | Komoriya et al. | |

FOREIGN PATENT DOCUMENTS 48-90538 11/1973 Japan .

Primary Examiner—Harry N. Haroian
Attorney, Agent, or Firm—Fitzpatrick, Cella, Harper & Scinto

[57] ABSTRACT

An apparatus for transferring images of a pattern of a reticle onto a semiconductor wafer, by projection exposure through a projection lens system having a plurality of lens components. In the apparatus, environmental conditions such as temperature, pressure, humidity, etc. are sensed and a focus error and a magnification error of the projection lens system related to the changes in the environmental conditions are calculated. On the basis of the thus calculated focus error, the interval between the projection lens system and the semiconductor wafer in the direction of an optical axis of the projection lens system is adjusted, while, on the basis of the calculated magnification error, at least one of the lens components of the projection lens system is displaced in the direction of the optical axis of the projection lens system. By this, a satisfactory imaging performance of the projection lens system is stably assured, regardless of the changes in the environmental conditions.

6 Claims, 2 Drawing Sheets

PROJECTION EXPOSURE APPARATUS

This application is a continuation of application Ser. No. 139,106, filed Dec. 24, 1987, now abandoned; which was a continuation of application Ser. No. 891,595, filed Aug. 1, 1986, now abandoned.

FIELD OF THE INVENTION AND RELATED ART

This invention relates to a projection exposure apparatus and, more particularly, to a projection exposure apparatus usable, e.g., in the manufacture of semiconductor devices such as large scaled integrated circuits or the manufacture of liquid crystal panel display devices, for exposing with radiation and by use of a projection optical system a workpiece such as a semiconductor wafer to a pattern formed on a mask thereby to transfer the pattern of the mask onto the workpiece.

In the field of manufacture of semiconductor devices, the tendency to higher capacities of integrated circuits has enforced further improvements in accuracy of the formation of very fine patterns. For example, for the manufacture of 1 M (megabit) dynamic random access memory which is a typical one of very large scaled integrated circuits (VLSI), a minimum line width of 1 micron and a pattern overlay accuracy of 0.2 micron are required. To meet such requirements, recent projection exposure apparatuses employ high-resolution projection lens system.

Usually, the critical resolving power R and the depth of focus $\delta$ of the projection lens system are determined by the numerical aperture NA of the lens system and the wavelength $\lambda$ of light used for the exposure, and they can be expressed as follows:

$$R = 0.8\lambda/(NA) \quad (1)$$

$$\delta = \pm \lambda/2(NA)^2 \quad (2)$$

It is seen from equation (1) that, to improve the resolving power, a shorter wavelength should be used or a larger numerical aperture should be employed. It is also seen from equation (2) that the depth of focus will be degraded where a shorter wavelength or a larger numerical aperture is used in an attempt to obtain higher resolving power. For example, where the wavelength $\lambda=436$ microns and the numerical aperture $NA=0.35$, then the critical resolving power $R=1$ micron but the depth of focus $\delta=\pm 1.8$ microns.

In consideration thereof and in order to accurately position the semiconductor wafer within such extraordinarily narrow range of the depth of focus, a number of different types of automatic focusing systems have been proposed. In the automatic focusing systems currently employed in the projection exposure apparatuses, however, a reference plane is defined at a certain distance from the end face of the barrel of the projection lens system and the position of the semiconductor wafer is adjusted so that a certain distance or interval is maintained from the reference plane to the wafer surface. With such arrangement, the wafer surface can be exactly placed at the focus position with a very high accuracy, provided that the focus position (or the focus reference plane) of the projection lens system is held fixed. If, however, the focus position is deviated for any reason, it is no more possible to place the wafer surface at the focus position.

In another aspect, the pattern overlay error, that is the error in superimposing different patterns of different masks when they are transferred onto the wafer, is caused not only by an alignment error between the mask and the wafer. An error in the manufacture of a mask pattern as well as an error in the characteristics of the projection lens system, such as a magnification error, distortion, etc., are factors causing the pattern overlay error. These errors in combination cause the pattern overlay error. In view of this, it will be necessary that, for the requirement of the pattern overlay accuracy of an order of 0.2 micron, the magnification error of the projection lens system is held sufficiently low such as of an order of 0.1 micron.

In order to assure such high performance of the projection exposure apparatus, a careful consideration should be made upon the effect of changes in the refractive index of an air (ambient air) due to changes in the temperature, pressure and/or humidity. The change in refractive index of the air changes the relative refractive index of a glass material forming the lens elements of the projection lens system, thus resulting in unpreferable changes in the focus position and/or magnification of the projection lens system. For example, the change in focus position or magnification resulting from a usually expectable pressure change by an amount approx. 20 mb, is of a significantly large amount which can not be neglected, in comparison with the above-described depth of focus $\pm 1.8$ micron or the tolerance 0.1 micron set for the magnification error.

The conventional projection exposure apparatuses are, however, defenseless relative to the changes in the focus position and/or magnification of the projection lens system due to the change in refractive index of the air resulting from the changes in the temperature, pressure and/or humidity. As described in the foregoing, with the automatic focusing systems currently employed in the projection exposure apparatuses, the wafer surface can not be brought into coincidence with the focus position if the focus position is deviated. Therefore, a high resolving power is not attainable. Also, if the magnification changes, a high pattern overlay accuracy is no more attainable with respect to the different mask patterns when they are transferred onto the semiconductor wafer.

SUMMARY OF THE INVENTION

It is accordingly a primary object of the present invention to provide a projection exposure apparatus by which high resolution and high pattern-overlay accuracy can be stably retained, regardless of changes in refractive index of an air (ambient air) due to changes in the temperature, pressure and/or humidity.

It is another object of the present invention to provide a projection exposure apparatus which is suitably usable in the manufacture of semiconductor devices.

Briefly, according to the present invention there is provided an apparatus for transferring, by projection exposure, a pattern of a first object onto a second object, said apparatus comprising: a projection optical system having a plurality of lens components; illumination means for irradiating the first object with light thereby to transfer the pattern of the first object onto the second object with an aid of said projection optical system; means for detecting at least one of a temperature, a pressure and a humidity; means for calculating an amount of a focus error and a magnification error of said projection optical system on the basis of the result of detection by said detecting means; first adjusting means for adjusting an interval between said projection optical system and the second object in a direction of an optical axis of said projection optical system on the basis of the focus error detected by the calculation by said calculating means; and second adjusting means for adjusting a position of at least one of the lens components of said projection optical system in the direction of the optical system on the basis of the magnification error detected by the calculation by said calculating means.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
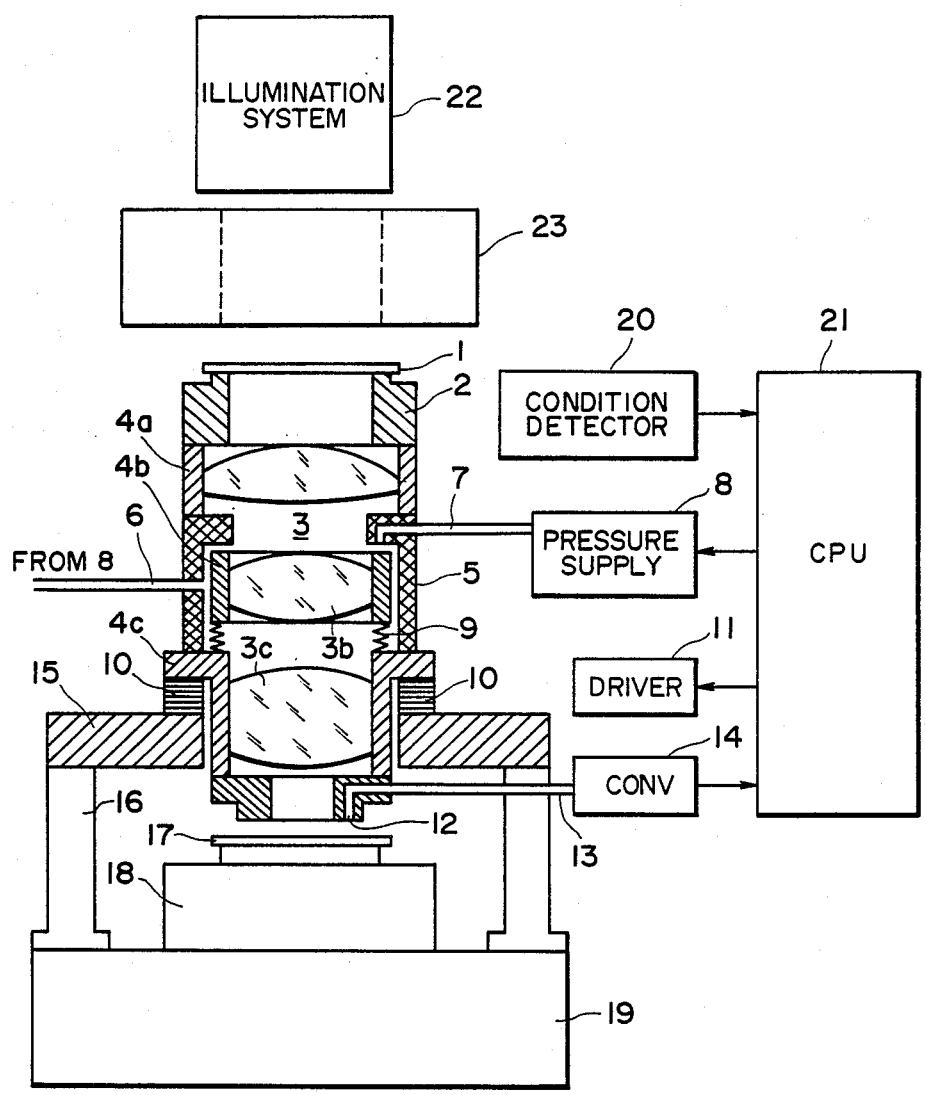
FIG. 1 is a partially sectional view schematically and diagrammatically showing a projection exposure apparatus according to an embodiment of the present invention.

Referring first to FIG. 1, there is shown a projection exposure apparatus according to one embodiment of the present invention. In FIG. 1, the apparatus includes a mask stage 2 for holding a mask 1 having a pattern, not shown. A reduction projection lens system 3 is provided to project the pattern of the mask 1 onto a wafer 17. The projection lens system 3 is of the type that it is telecentric at least on the wafer 17 side and includes a plurality of lens components such as at $3a$–$3c$, each made of a glass material. The projection lens system 3 has barrels $4a$–$4c$ for supporting the lens components $3a$–$3c$, respectively. As will be described later in more detail, the barrel $4b$ is movable in the direction of an optical axis of the projection lens 3, and the movement of the barrel $4b$ is guided by an air-bearing guide 5 having a plurality of air-discharging pads (not shown). To this air-bearing guide 5, a static pressure (air pressure) is supplied via a tube 6 providing a static pressure passage. Another tube 7 provides a passage for supplying a pressure (air pressure) for driving the barrel $4b$ in the direction of the optical axis of the projection lens system 3. The driving pressure for the barrel $4b$ is supplied from a pressure supplying source 8. While not shown in the drawing in detail, the pressure for driving the lens barrel $4b$ is applied thereto at plural points thereon so as to avoid unpreferable tilt of the lens component $3b$. Resilient means 9 such as a spring is provided to support the barrel $4b$ against the pressure applied thereto from the passage 7.

In this embodiment, the projection lens system 3 as a whole is movable in the direction of the optical axis thereof. And, a piezoelectric device 10 comprising a number of piezoelectric elements is provided to displace the projection lens system 3 in this direction. A driving circuit 11 is provided to drive the piezoelectric device 10. The apparatus further includes air-sensors having nozzles 12 (only one of which is illustrated) disposed at the lower end of the projection lens system 3. The air-sensors are adapted to measure the distance, in the direction of the optical axis of the projection lens system 3, between the wafer 17 surface and a predetermined reference plane which is set with respect to the projection lens system 3. A passage 13 supplies an air pressure to the air-sensors. A converter 14 is operative to convert a back pressure as sensed by each airsensor into an electric signal.

A base plate 15 is provided to support the projection lens system 3, the base plate 15 being supported by posts 16. The wafer 17 is held by a wafer stage 18 which is made translatable and rotatable in a plane perpendicular to the optical axis of the projection lens system 3. A surface plate 19 supports the major components of the exposure apparatus, as described.

The apparatus further includes an environmental condition detector 20 for detecting at least one of an ambient temperature, an ambient humidity and an ambient pressure of the projection lens system 3. A central processing unit (hereinafter "CPU") 21 is provided to control the exposure apparatus as a whole. Particularly, the CPU 21 is adapted to compute the amount of adjustment of the position of the projection lens system 3 on the basis of outputs supplied thereto from the converter 14 and/or the condition detector 20, as will be described later in more detail. Denoted in FIG. 1 by numeral 22 is an illumination system for providing a radiation such as light with which the wafer 17 is exposed to the pattern of the mask 1 whereby the mask pattern is transferred onto the wafer 17. An alignment scope 23 is adapted to detect, by way of the projection lens system 3, relative positional deviation between the mask 1 and the wafer 17.

The exposure apparatus of the present embodiment is what is called a step-and-repeat type in which images of the pattern of the mask 1 are transferred onto different areas on the wafer 17 in a step-and-repeat manner. First, in operation, the wafer 17 is placed on the wafer stage 18 by means of unshown wafer conveying system. Then, the wafer stage 18 carrying thereon the wafer 17 is moved to a position at which a predetermined area (shot area) on the wafer 17 is disposed under the projection lens system 3. Subsequently, the air-sensors having nozzles 12 are operated to detect the interval between the wafer 17 surface and the predetermined reference plane set with respect to the projection lens system 3, by use of the back pressure of the air discharged from the sensor nozzles 12. The detected value on the interval is compared with a preset value which has been determined as a desired distance from the reference plane, and the piezoelectric device 10 is actuated so that the distance from the reference plane to the wafer 17 surface becomes coincident with the preset value. By this, the wafer 17 surface is brought into exact coincidence with the focal plane of the projection lens system 3, and by which the focusing is accomplished. Subsequently, by use of the alignment scope 23, alignment marks formed on the mask 1 and alignment marks formed on the wafer 17 are detected thereby to detect the relative positional deviation between the mask and the wafer. Then, the wafer stage 18 is moved minutely so as to correct the relative positional deviation. By this, the alignment of the wafer 17 (i.e. the mask-to-wafer alignment) is accomplished. Thereafter, shutter means provided in the illumination system 22 is opened to execute the exposure operation, whereby the pattern of the mask 1 is transferred onto the predetermined shot area on the wafer 17 surface. Then, the above-described operations are repeated for each of the remaining shot areas on the wafer 17 with an aid of step-feeding by the wafer stage 18.

Description will now be made to adjustment of the focus position and the magnification. As described in the foregoing, the focus position and the magnification of the projection lens system 3 are changeable in accordance with the temperature, humidity and pressure. This is because of that the change in temperature, humidity and/or pressure causes a change in the refractive index of the air and such change in the refractive index of the air results in a change in the relative refractive index of the glass material of each of the lens components of the projection lens system 3; that the optical characteristics of the glass material change with the change in temperature; and that the barrel of the projection lens system is thermally expanded or contracted with the change in temperature, causing a change in an air space between its lens components. The focus error and the magnification error due to the changes in the environmental conditions can be detected on the basis of experiments or simulations. Where the temperature, the humidity and the pressure in a standard state are denoted by $P_0$ (°C.), $R_0$ (%) and $P_0$ (mb) and where the amounts of changes in the temperature, humidity and pressure from those in the standard state are denoted by $\Delta T$ (°C.) $\Delta R$ (%) and $\Delta P$ (mb), then the amount of shift of the focus position (i.e. the focus error to be corrected) $\Delta Z$ of the projection lens system 3 with respect to the standard state position and the amount of change in magnification (i.e. the magnification error to be corrected) $\Delta M$ from the standard state magnification can be given by the following equations:

$$\Delta Z = K_{11}\Delta T + K_{12}\Delta R + K_{13}\Delta P \quad (3)$$

$$\Delta M = K_{21}\Delta T + K_{22}\Delta R + K_{23}\Delta P \quad (4)$$

wherein characters $K_{11}$-$K_{23}$ are coefficients predetected.

In the structure shown in FIG. 1, the lens element 3b is supported by the barrel 4b. The barrel 4b is guided by the air-bearing guide 5 so that it is movable in the direction of the optical axis, whereas the displacement of the barrel 4b in a plane perpendicular to the optical axis is substantially inhibited. While in FIG. 1 only one passage 7 is illustrated, actually the apparatus is provided with a plurality of air pressure passages for discharging the air pressure from the pressure supply source 8 toward the barrel 4b. Thus, by the air pressure supplied from the pressure supply source 8 and discharged from tip ends of the driving pressure passages 7 toward the barrel 4b, the position of the lens component 3b in the direction of the optical axis is adjustable. The interrelation between the supply of pressure to the barrel 4b and the displacement of the lens component 3b in the direction of the optical axis is detected on the basis of preparatory measurement. When the position of the lens component 3b in the direction of the optical axis is changed by such position adjusting mechanism as described, the air spaces defined in the projection lens system 3 are changed such that the focus position and/or the magnification of the projection lens system 3 can be adjusted. The change in focus position and the change in magnification resulting from displacement of the lens component 3b can be detected on the basis of experiments or simulations and, where the amount of displacement of the lens component 3b from its standard state position is denoted by $\Delta x$, the amount of shift of the focus position ($\Delta Z$) and the amount of change in magnification ($\Delta M$) can be given by the following equations:

$$\Delta Z = K_{14}\Delta x \quad (5)$$

$$\Delta M = K_{24}\Delta x \quad (6)$$

wherein characters $K_{14}$ and $K_{24}$ are predetected coefficients.

It is seen from equations (3)–(6) that, when the amounts of changes in the temperature, humidity and pressure from those in the standard state are $\Delta T$ (°C.), $\Delta R$ (%) and $\Delta P$ (mb), respectively, and when the amount of displacement of the lens component 3b from its standard state position is $\Delta x$, then the amount of shift of the focus position $\Delta Z$ is equal to the sum of the right-hand terms of equations (3) and (5), while the amount of change in magnification $\Delta M$ is equal to the sum of the right-hand terms of equations (4) and (6). Namely, $$\Delta Z = K_{11}\Delta T + K_{12}\Delta R + K_{13}\Delta P + K_{14}\Delta x \quad (7)$$

$$\Delta M = K_{21}\Delta T + K_{22}\Delta R + K_{23}\Delta P + K_{24}\Delta x \quad (8)$$

To remove M, i.e. to correct the magnification error, the amount of $\Delta x$ is detected on the basis of equation (9) set forth below while putting $\Delta M = 0$ into equation (8), and the lens component 3b is moved or shifted from its standard state position by an amount corresponding to the detected $\Delta x$.

$$\Delta x = -(K_{21}/K_{24})\Delta T - (K_{22}/K_{24})\Delta R - (K_{23}/K_{24})\Delta P \quad (9)$$

At this time, the focus error $\Delta Z$ can be expressed, by substituting equation (9) into equation (7), as follows:

$$\Delta Z = [K_{11} - (K_{14}K_{21}/K_{24})]\Delta T + \quad (10)$$
$$[K_{12} - (K_{14}K_{22}/K_{24})]\Delta R +$$
$$[K_{13} - (K_{14}K_{23}/K_{24})]\Delta P$$

Thus, the focusing system including the piezoelectric device 10 is actuated to execute the focus adjustment by an amount corresponding to the detected focus error $\Delta Z$, whereby the wafer 17 surface is brought into exact coincidence with the focus position.

In the embodiment shown in FIG. 1, the condition detector 21 is arranged to detect an ambient temperature T (°C.), an ambient humidity R (%) and an ambient pressure P (mb) of the projection lens system 3, and data concerning the detected environmental conditions is supplied to the CPU 21. On the basis of the thus supplied data, the CPU 21 calculates the amounts of changes in the environmental conditions from respective standard state values, namely $\Delta T = T - T_0$, $\Delta R = R - R_0$, $\Delta P = P - P_0$. Also, the CPU 21 computes $\Delta x$ in accordance with equation (9), and supplies the result of calculation on the value $\Delta x$ to the pressure supplying source 8. In response thereto, the pressure source 8 produces such an air pressure that is effective to cause displacement of the barrel 4b by an amount $\Delta x$ thereby to adjust the position of the lens component 3b. By this, the magnification error of the projection lens system 3 is avoided and, whereby, a substantially constant magnification of the projection lens system 3 is maintained.

Furthermore, the CPU 21 computes ΔZ in accordance with equation (10), and supplies the result of computation on the focus error ΔZ to the piezoelectric-device driving circuit 11. In response thereto, the driving circuit 11 drives the piezoelectric device 10 to displace the projection lens system 3 by an amount corresponding to the detected focus error ΔZ. This means that the preset value of the focusing system with respect to the distance between the reference plane and the wafer surface is corrected by an amount corresponding to ΔZ, and the position of the wafer 17 can be adjusted accordingly so as to be exactly coincident with the focus position of the projection lens system 3. In place of adjusting the position of the projection lens system 3, the position of the wafer 17 in the direction of the optical axis may of course be adjusted for the sake of focusing.

Figure 2:
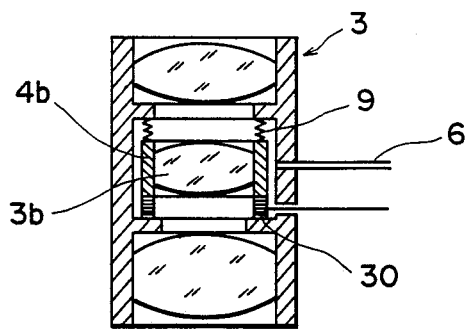
FIG. 2 is a sectional view of a major portion of a projection exposure apparatus according to another embodiment of the present invention.

Referring now to FIG. 2, a projection exposure apparatus according to another embodiment of the present invention will be described. FIG. 2 shows a projection lens system 3 which is arranged in accordance with the second embodiment. Reference numerals or characters similar to those used in FIG. 1 embodiment are assigned to elements having similar functions as of those of corresponding elements of the FIG. 1 embodiment. Denoted in FIG. 2 by reference character 3b is a position-adjustable lens element of the projection lens system 3; by 4b, a barrel for supporting the lens component 3b; by 6, a static pressure supplying passage for an air-bearing guide; by 9, resilient means such as a spring for supporting the lens barrel 4b; and by 30, a piezoeletric device comprising a number of piezoelectric elements adapted to displace the barrel 4b, against the spring force of the spring 9, in a direction of the optical axis of the projection lens system 3. The major distinction of the present embodiment over the FIG. 1 embodiment lies in that a suitable electric voltage is applied to the piezoelectric device 30 and, by which, the position of the lens component 3b in the direction of the optical axis of the projection lens system 3 is controlled.

Figure 3:
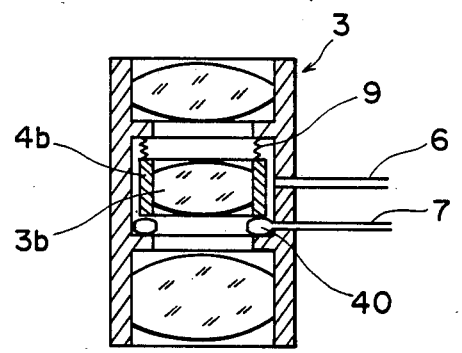
FIG. 3 is a sectional view of a major portion of a projection exposure apparatus according to a further embodiment of the present invention.

A third embodiment of the present invention will be described with reference to FIG. 3. FIG. 3 shows a projection lens system 3 arranged in accordance with the third embodiment. Reference numerals or characters similar to those used in the preceding embodiments are assigned to elements having functions similar to those of the corresponding elements of the foregoing embodiments. What is the major distinction of the present embodiment over the preceding embodiments is the provision of a diaphragm 40 which is effective to move a lens barrel 4b, supporting a lens component 3b, in the direction of the optical axis of the projection lens system 3 against a spring force of a spring 9. The diaphragm 40 comprises, in this embodiment, an endless tubular member having a ring-like shape, and a driving pressure for moving the lens barrel 4b is supplied from an unshown source via a driving pressure passage 7. With this arrangement, the position of the lens component 3b in the direction of the optical axis of the projection lens system is controlled under the influence of the fluid pressure supplied to the diaphragm 40.

In accordance with the embodiments described in the foregoing, the exposure apparatus upon execution of the exposure operation becomes hardly susceptible to the effects of the ambient temperature, humidity and pressure. This allows use of the exposure apparatus in relatively hard conditions.

Moreover, the use of air-bearing guide as a component of a position adjusting mechanism for the optical member for the sake of correction of the magnification error, is effective to prevent eccentricity or tilt of the optical member resulting from displacement thereof. Accordingly, occurrence of unwanted optical aberrations can be avoided. Also, a larger stroke can be defined for the displacement of the optical member. Therefore, satisfactory resolution and magnification accuracy are attainble stably, relative to different environmental conditions.

As the driving source for displacing the lens barrel 4b, various kinds of driving sources are usable. For example, magnetostrictor means or a combination of such magnetostrictor means with a piezoelectric device may be used.

While the invention has been described with reference to the structures disclosed herein, it is not confined to the details set forth and this application is intended to cover such modifications or changes as many come within the purposes of the improvements or the scope of the following claims.

What is claimed is:

1. A device for displacing a predetermined optical element which is a constituent of a projection optical system, in a direction of an optical axis of the projection optical system, said device comprising:
   an air-bearing guide for guiding displacement of the optical element in the direction of the optical axis; and
   air supplying means for moving the optical element in the direction of the optical axis by using air pressure.

2. A projection exposure apparatus for projecting a pattern of a first object upon a second object, said apparatus comprising:
   a projection lens system having lens elements and an optical axis;
   a support for supporting at least one of said lens elements of said projection lens system, said support being displaceable in a direction of the optical axis of said projection lens system;
   an air-bearing guide for guiding displacement of said support in the direction of the optical axis of said projection lens system; and
   air supplying means for moving said support in the direction of the optical axis of said projection lens system by using air pressure.

3. An apparatus according to claim 2, further comprising means for detecting a change in an ambient pressure of said projection lens system and means for controlling said air supplying means on the basis of an output of said detecting means so as to displace said at least one lens element to maintain a substantially constant magnification in regard to the projection of the pattern upon the second object with use of said projection lens system.

4. An apparatus according to claim 2, further comprising means for detecting a change in an ambient pressure of said projection lens system and means for controlling said air supplying means on the basis of an output of said detecting means so as to displace said at least one lens element to adjust a focus of said projection lens system.

5. An apparatus according to claim 2, further comprising means for controlling said air supplying means to adjust magnification in regard to the projection of the pattern upon the second object with use of said projection lens system.

6. An apparatus according to claim 3, further comprising means for adjusting an interval between the second object and said projection lens system in the direction of the optical axis of said projection lens system so that a focus position of said projection lens system lies on the plane of the second object.

* * * * *